(12) United States Patent
Emken

(10) Patent No.: US 6,274,191 B1
(45) Date of Patent: Aug. 14, 2001

(54) PRECISE REGULATION OF PYROCARBON COATING

(75) Inventor: Michael R. Emken, Austin, TX (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 08/206,973

(22) Filed: Mar. 7, 1994

(51) Int. Cl.$^7$ .............................. C23C 16/52; B05D 5/12; B05D 7/00

(52) U.S. Cl. .......................... 427/8; 427/213; 427/249.1

(58) Field of Search .............................. 427/2.24, 8, 213, 427/249.1, 255.9; 118/303, 712, 716

(56) References Cited

U.S. PATENT DOCUMENTS

| | | | |
|---|---|---|---|
| 3,399,969 | 9/1968 | Bokros et al. ....................... 23/209.1 |
| 3,977,896 | 8/1976 | Bokros et al. ....................... 427/213 |
| 4,194,027 | * 3/1980 | Adams et al. ....................... 427/249 |
| 4,329,260 | * 5/1982 | Lester et al. ....................... 252/446 |
| 4,354,635 | * 10/1982 | Burnert et al. ....................... 239/11 |
| 4,546,012 | 10/1985 | Brooks ................................. 427/213 |
| 4,594,270 | 6/1986 | Brooks ................................. 427/213 |
| 5,262,104 | * 11/1993 | Schwartz ............................... 264/81 |
| 5,284,676 | * 2/1994 | Accuntius et al. ........................ 427/8 |
| 5,284,678 | 2/1994 | Accuntius ............................. 427/213 |
| 5,328,713 | * 7/1994 | Emken et al. ............................ 427/8 |

FOREIGN PATENT DOCUMENTS 0055406   3/1985   (EP) .

* cited by examiner

Primary Examiner—Brian K. Talbot
(74) Attorney, Agent, or Firm—Thomas G. Berry; Daniel W. Latham

(57) ABSTRACT

Deposition of a pyrocarbon coating of precise thickness onto one or more substrates being levitated along with a bed of particles in a fluidized bed coating enclosure is accomplished by varying the amount of hydrocarbon supplied to the bed as a part of an upward levitating flow to compensate for changes which are detected in the size of the fluidized bed. Increases and decreases in the size of the bed are detected by monitoring either the differential pressure above and below the bed or the weight of the bed, and compensating changes are made to return the bed to its desired size by changing the flow rate of hydrocarbon. For example, when a growth in bed size is detected that is not attributable to an aberration in either particle supply or withdrawal, the amount of hydrocarbon being supplied to the bed is decreased so as to cause the size of the bed to gradually return to its desired value.

17 Claims, 2 Drawing Sheets

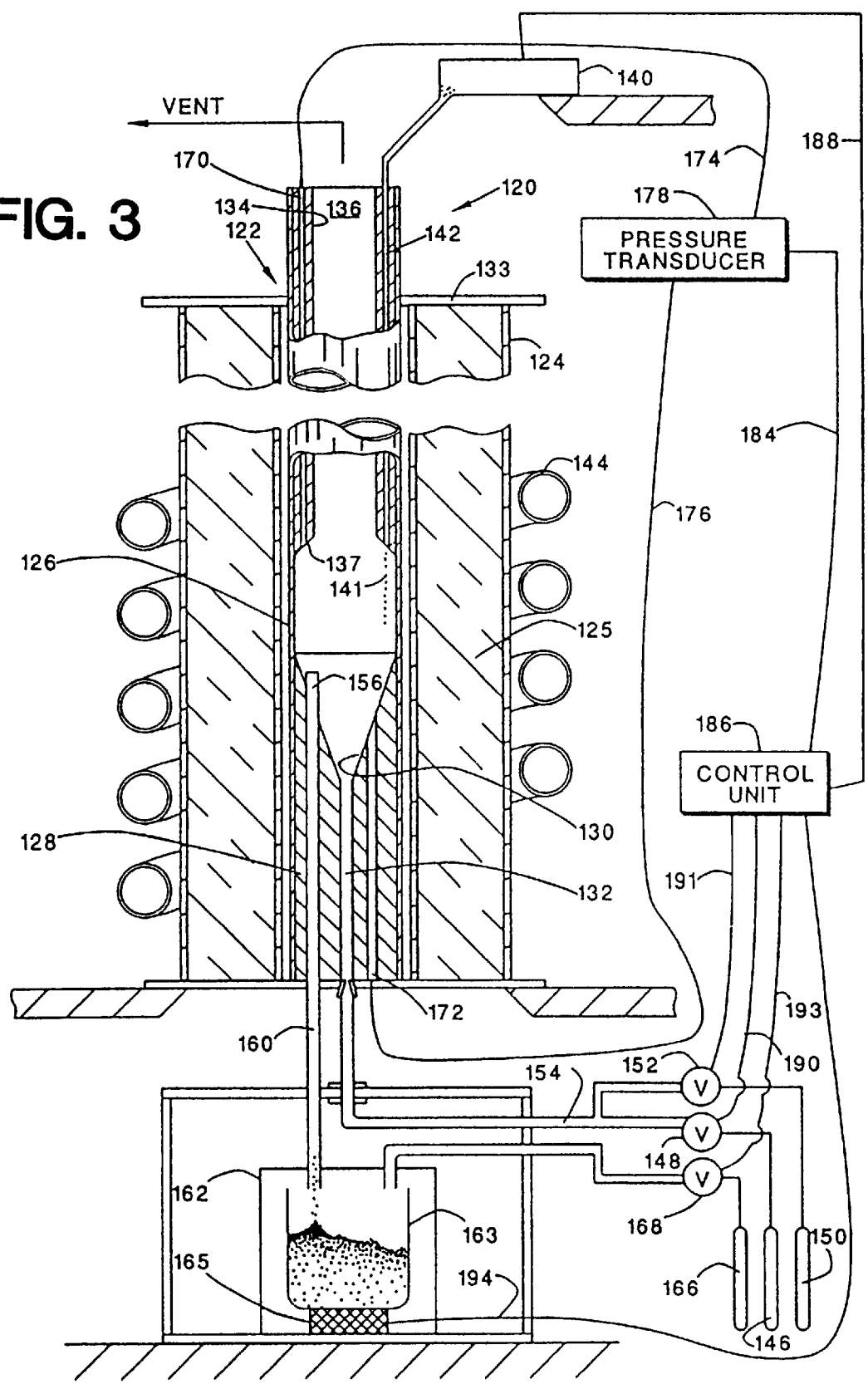

PRECISE REGULATION OF PYROCARBON COATING

This application relates to the deposition of a pyrocarbon onto a substrate being levitated in a fluidized bed of particles, and it more specifically relates to processes and apparatus for very carefully controlling pyrocarbon deposition to achieve a precise coating thickness.

BACKGROUND OF THE INVENTION

Pyrolytic carbon is generally deposited by thermally decomposing a gaseous hydrocarbon or other carbonaceous substance in vaporous form in the presence of a substrate upon which the deposition takes place. It is well known to coat substrates with layers of pyrolytic carbon for various different purposes. In this respect, the coating may oftentimes completely envelop the substrate, and the composite coated substrate may be the desired end product. In other instances, a disposable object or mandrel may be used as the substrate and be coated with a fairly thick layer of pyrolytic carbon; subsequently, the mandrel is machined away or otherwise removed whereby the monolithic coating becomes the desired end product, e.g., European Patent No. 0 055 406, inventors: Bokros et al., incorporated herein by reference. The present invention is suitable for use with all such instances, even if the underlying substrate is eventually removed.

When pyrolytic carbon is deposited in a fluidized bed apparatus, one of the variables upon which the structure of the pyrolytic carbon will be dependent is the available deposition surface area, relative to the volume of the furnace enclosure wherein the deposition is occurring. Pyrolytic carbon which has a microstructure that is free of growth features will be deposited when the relative amount of deposition surface area is fairly high. Thus, when relatively large objects, for example, objects having at least one dimension equal to 5 mm or more, are being coated, an ancillary bed of small particles (usually of a size measured in hundreds of microns) are included within the furnace enclosure together with the larger object or objects. This arrangement provides sufficient available total surface area to assure that pyrolytic carbon having the desired crystalline form will be deposited. In addition, the random motion of large objects in fluidized beds provide for a relatively uniform deposition of carbon on all surfaces.

However, whenever such submillimeter particles are being coated in a fluidized bed along with one or more substrates of interest, the total surface area being provided by the particles begins to increase significantly as the diameters of the pyrolytic carbon-coated particles grow. This change in the available deposition surface area in the fluidized bed will result in a change in the physical characteristics of the pyrolytic carbon being deposited and will also result in an increase in the rate at which pyrocarbon is deposited. Moreover, should the fluidized bed reach some maximum size, it will collapse, which thus limits the thickness of pyrocarbon coating that can be deposited on levitated substrates under constant conditions. Changes in the physical characteristics of the pyrocarbon being deposited may be undesirable for any of a number of reasons.

It had previously been found that pyrolytic carbon having good structural strength and uniform physical properties could be deposited as relatively thick coatings upon relatively large objects in the accompaniment of particles if the available fluidized bed surface area is maintained relatively constant by withdrawing particles which have become enlarged in size as a result of coating and feeding smaller size particles into the deposition enclosure. Very generally, the availability of a relatively large amount of deposition surface area in a furnace enclosure of a given volume facilitates the efficient deposition of pyrolytic carbon which is either isotropic or laminar in microstructure and without growth features. In contrast when carbon is deposited on a fixed substrate (e.g., a mandrel) in a chamber without a bed of particles, large gradients in gas composition are established at the gas-solid interfaces where the deposition is occurring, and growth features develop in the microstructure of the deposited carbon. Illustrations and theoretical considerations are reviewed in J. C. Bokros, "The Preparation, Structure, and Properties of Pyrolytic Carbon," in *Chemistry and Physics of Carbon*, Vol. 5, P. L. Walker (ed.) Marcel Dekker, New York, 1969, Chapter 1.

The crystalline structure, the density and other physical properties, such as the coefficient of thermal expansion, of pyrolytic carbon deposited by the thermal decomposition of a vaporous carbonaceous substance are dependent upon several independently variable operating conditions within the coating apparatus being employed. These conditions include the temperature of the substrate surfaces upon which the deposition is occurring, the overall chemical composition of the atmosphere from which deposition is occurring, the partial pressure of the vaporous carbonaceous substance, the surface area to volume ratio in the active deposition region of the coating apparatus, and the contact time (a parameter based upon the gas flow rate and cross sectional area of the furnace enclosure). Although various of these conditions can be easily regulated and therefore maintained at a substantially constant desired value in many different types of coating apparatus, the surface area to volume ratio is inherently subject to constant change because there is a continuous gradual increase in the total surface area as the items being coated grow in size as the result of the deposition thereupon. When a bed of small spheroids or the like, having an average size between about 50 microns and 600 microns, is present in the active deposition surface region, such small particles increase relatively rapidly in surface area as the diameters of these particles grow during deposition of pyrolytic carbon.

A desired amount of bed surface area is initially provided by starting with an appropriate amount of particles of a particular average size to constitute the fluidized bed for use in coating a plurality of substrates levitated therein in a coating zone of particular size. This amount of initial surface area in a coating zone of particular volume is chosen to produce crystalline pyrolytic carbon having the physical properties desired. Thereafter, as the growing thickness of the deposited pyrolytic carbon causes the total surface area in the coating zone to increase, withdrawal of some of the coated particles is initiated so as to decrease the total number of these particles of larger size, and replacement of the particles being withdrawn with particles of much smaller size is also begun.

In coating operations where it is desirable to employ a relatively large surface area to volume ratio, a coating apparatus is employed that appropriately maintains such a bed of particles in motion and in association with the larger substrates that are being coated. Examples of suitable coating apparatus of this type include, fluidized bed coaters and rotating drum coaters; fluidized bed coaters are preferred.

One example of a suitable coating apparatus is shown in U.S. Pat. No. 3,399,969 to Bokros, et al., the disclosure of which is incorporated herein by reference, which points out that the pyrocarbon coating of relatively large objects, such as objects having a dimension of about 5 millimeters or greater, in the presence of an ancillary bed of small particles (i.e. of a size measured in tens or hundreds of microns), is best controlled by controlling the available deposition surface area relative to the volume of the coating enclosure wherein the actual deposition is taking place.

In U.S. Pat. No. 3,977,896 to Bokros and Akins, the disclosure of which is incorporated herein by reference, an improved process was described and illustrated for depositing pyrolytic carbon coatings of substantial thickness which would have a very uniform crystallinity throughout the entire thickness of the pyrocarbon deposited. Such uniformity was achieved by maintaining the total deposition surface area within the coating enclosure relatively constant by adding particles of small size to the coater while coated particles (which have grown in size) are being removed from the enclosure at a controlled rate by regulating the rate of flow of an inert gas stream upward through a conduit through which the particles exit.

Subsequent to the issuance of the '896 patent, U.S. Pat. No. 4,546,012 issued to Brooks, the disclosure of which is incorporated herein by reference, which teaches an improved fluidized bed apparatus for coating such relatively large objects being levitated in association with a bed of particles, which maintains a constant bed size from a volumetric standpoint by employing a weir tube having a spillover entrance hole to define the maximum upper level of the fluidized bed by its location at a desired vertical level within the coating enclosure. Preferably the weir tube is closed at its top and has its spillover hole facing away from the centerline of the coating enclosure. Sufficient purge flow of inert gas upward through the tube is maintained so as to prevent any substantial quantity of dust from gravitating down the tube with the coated particles being withdrawn. U.S. Pat. No. 4,594,270 also issued to Brooks, the disclosure of which is incorporated herein by reference, and shows an apparatus for removing particles from a desired level within such a fluidized bed within which a larger object is being levitated and coated by pyrolytic decomposition. This patent teaches the employment of a vertically slidable sampling tube, preferably controlled from the exterior of the furnace, which can be located so as to have its opening at a desired vertical level from which the sample is to be withdrawn. Flow of inert gas through the sampling tube is controlled so as to selectively allow particles to be withdrawn from the bed when the tube is at the desired vertical level.

Although the foregoing patents disclose generally acceptable processes for controlling pyrolytic deposition within a fluidized bed system, it is extremely difficult, if not impossible, to determine the actual size of the bed surface area at any moment. Moreover, as coating processes become more sophisticated, there is a desire to be able to even more precisely control the characteristics of the pyrocarbon being deposited. As a result, more improved methods of control have been developed. U.S. Pat. No. 5,284,676 issued Feb. 8, 1994, to Accuntius, et al., the disclosure of which is incorporated herein by reference, discloses a system for monitoring the differential pressure vertically about the fluidized bed and making adjustments to the number of particles which constitute the fluidized bed in response to changes determined in such differential pressure in order to maintain precise coating operation. Copending U.S. patent application Ser. No. 08/032,627, filed Mar. 16, 1993, which is assigned to the assignee of the present application, the disclosure of which is incorporated herein by reference, discloses a comparable system which monitors the overall weight of the fluidized bed for changes and similarly compensates for changes that are detected by changing the number of particles in the fluidized bed in order to again maintain a substantially constant coating operation or the like.

Although the last-mentioned U.S. patent and U.S. patent application disclose systems and methods capable of providing precise regulation, improvements in such systems and methods are constantly being sought so as to provide even better control of pyrocarbon deposition, particularly for the making of components for medical devices, such as heart valves, wherein reproducibility and precision are considered to be of utmost importance.

SUMMARY OF THE INVENTION

It was previously felt that attaining pyrocarbon of consistent, reproducible crystalline character was dependent upon maintaining the temperature, the hydrocarbon partial pressure, the bed surface area and the contact time at constant values, thus in order to compensate for changes that would inevitably occur in the total surface area of a dynamic system in a fluidized bed pyrocarbon coater, it was felt necessary to always make adjustments in the number of ancillary particles in the bed. It has now been found that both precision in pyrocarbon deposition rate and consistency of crystalline carbon properties can be maintained without altering the rates at which particles are supplied to the coating zone or removed from the coating zone; such can be accomplished by merely changing, within reasonable limits, the amount of hydrocarbon being supplied to the coating zone. For example, if an increase in bed size is detected beyond the initial target value, compensation can be made to return the bed size to the target value by lowering the amount of hydrocarbon being supplied to the coater. It was surprisingly found that relatively small changes in the amount of hydrocarbon would be effective to sufficiently change the amount of carbon being deposited per unit time in the coating zone to return the bed size to the target value but would not change the crystalline properties of the pyrocarbon in any measurable amount.

BRIEF DESCRIPTION OF THE DRAWINGS

FIG. 3 is a fragmentary schematic view partially in section of a fluidized bed apparatus for depositing pyrocarbon onto objects being levitated in association with a bed of particles, together with an alternative embodiment of an associated control mechanism for carrying out pyrocarbon coating methods embodying various features of the invention.

DETAILED DESCRIPTION OF THE PREFERRED EMBODIMENTS

Figures 1, 2:
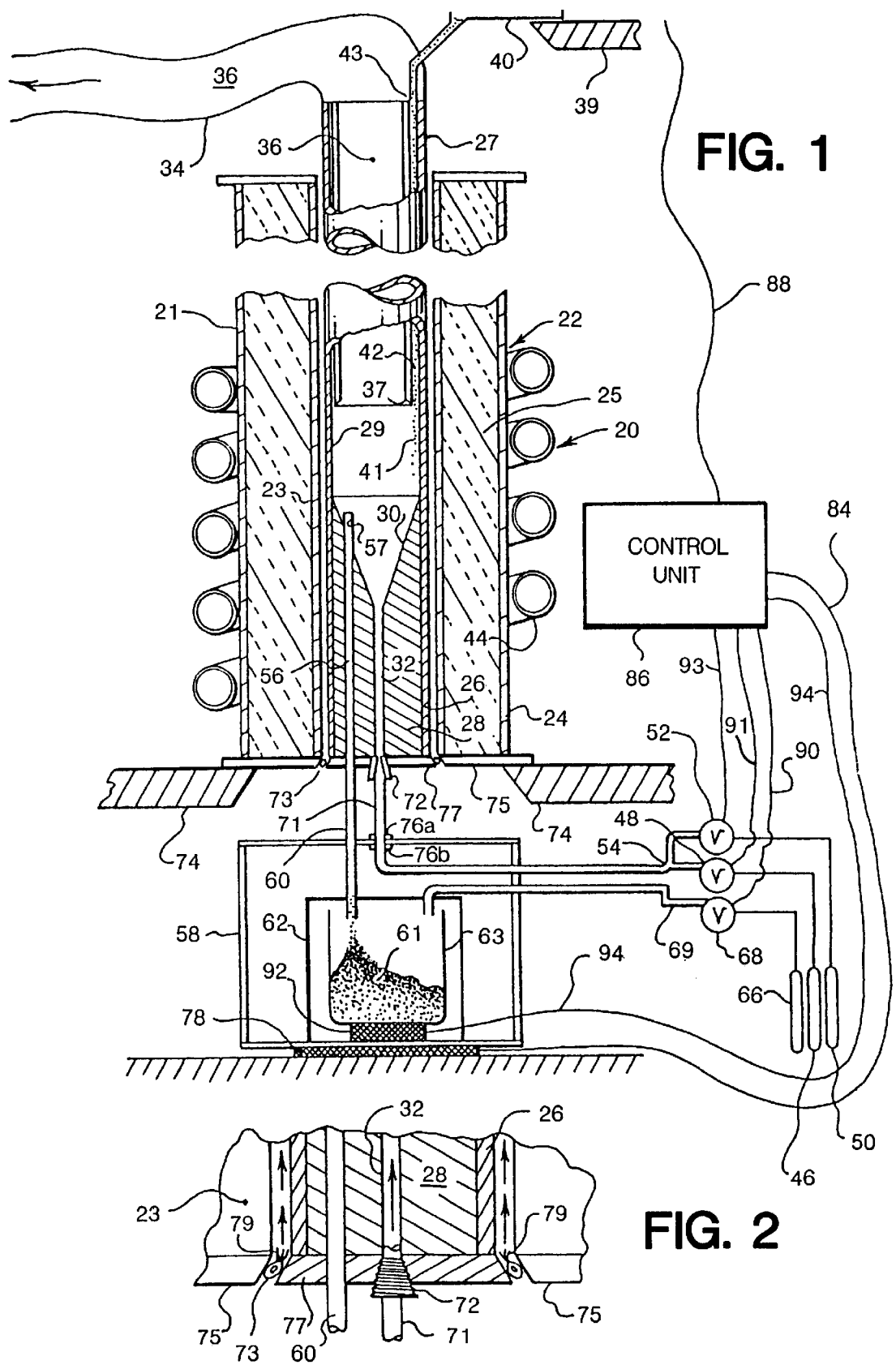
FIG. 1 is a schematic view, partially in section, of a fluidized bed apparatus for depositing pyrolytic coatings upon objects being levitated in association with a bed of particles, together with associated control mechanism for the operation thereof in a manner embodying various features of the present invention.
FIG. 2 is a fragmentary sectional view of the apparatus illustrated in FIG. 1 showing an annular seal suitable for use in the apparatus.

Illustrated in the FIG. 1 is a suitable fluidized bed coating apparatus 20 which includes a furnace 22 having an outer annular heating section 21 which surrounds a coating enclosure 29. The coating enclosure 29 is separated from the surrounding annular heating section 21, which includes an outer quartz tube 24 which confines a layer of insulation 25 between it and a graphite inner susceptor tube 23, and is defined generally by a central furnace tube 26 which interconnects with an upper stack 27 and a lower nozzle 28. The lower nozzle 28 mates with the bottom end of the furnace tube 26 and provides the coating enclosure with a conical bottom surface 30; it includes a central passageway 32 that extends vertically upward therethrough and is preferably coaxial with the furnace tube 26 which is of circular cross-section. Although there should be no size limitations on such coaters, of general interest are coaters having furnace tubes 26 not greater than about a foot in diameter and particularly those having an interior diameter of about 6 inches or less. The levitating atmosphere flows upward through this passageway 32 to enter the coating enclosure.

An exit passageway 36 from the coating enclosure is defined by a flexible exhaust duct 34 or the like that extends downward onto the furnace 22. The hot levitating and coating gases leaving the fluidized bed coater pass through this upper exit passageway 36 and flow via the flexible exhaust duct 34 leading to an appropriate vent (not shown). Preferably, the vent arrangement is independently supported so that substantially none of the weight of the vent is transmitted onto the furnace 22.

A particle feeder 40 is mounted generally above the fluidized bed coater 20 and is designed to feed minute particles 41 into the coating enclosure at a desired rate. One such suitable particle feeder is illustrated and described in U.S. Pat. No. 5,332,337, filed Jan. 14, 1992, which is assigned to the assignee of the present application, the disclosure of which is incorporated herein by reference. The particles from the feeder 40 enter the coater through an entrance conduit 42 which extends downward through the wall of the upper stack 27 that terminates in a frustoconical lower surface 37 adjacent its lower end which mates with the upper end of the furnace tube 26. The particle feeding device 40 is coupled to the entrance conduit via a slidable linkage 43 whereby the weight of the particle feeding device 40 is substantially not transmitted to the coating enclosure. Instead, the weight of the particle feeding device 40 and of particles contained therein is substantially transmitted to a support 39. A suitable induction or alternating current heating coil 44, as is well known in this art, is included as a part of the annular heating section 21, and it is disposed in surrounding relationship to the outer quartz tube 24 in order to heat the inner susceptor tube 23 and thereby heat the active deposition region of the coating enclosure together with the small particles and the objects being levitated in order to bring them to the desired deposition temperature for coating.

The coating operation is carried out by establishing a levitated bed of minute particles, submillimeter in size, which is maintained in the lower region of the coating enclosure 29; this bed extends, into the conical region defined by the upper surface 30 of the nozzle 28 (sometimes referred to as the conical bottom surface 30 of the enclosure). Once the bed is established, one or more objects to be coated, such as annular valve bodies or occluders for prosthetic heart valves, are appropriately loaded into the bed through the upper exit passageway 36; once in the bed, they will be supported among the fluidized particles by the upwardly flowing gaseous stream flowing through the passageway 32. The bed of particles and the objects to be coated are then appropriately heated to raise their temperature to the desired coating temperature by applying an appropriate amount of electrical power to the heating coil 44. It may be preferable to first bring the particle bed to temperature before adding the substrates to be coated. Electrical power is applied to the heating coil 44 at about 10,000 cycles per second, inductive coupling between the thin inner susceptor tube 23 and the heating coil 44 which causes the skin temperature of the thin inner susceptor tube 23 to rise, thereby raising the temperature within the coating enclosure 29. The temperature within the coating enclosure 29 is appropriately monitored and controlled, as is well known in this art, using either electrical (e.g. thermocouple) or optical temperature-measuring devices, the latter of which could be effected through a viewing port (not shown).

The upwardly flowing gas stream, during the time of coating, is made up of a mixture of an inert fluidizing gas plus a gaseous hydrocarbon, for example methane, ethane, propane, butane, acetylene, propylene or a mixture thereof. If it is desired that the substance being deposited is not 100 percent pyrocarbon but instead is an alloy, for example, of silicon carbide and pyrocarbon, a desired amount of an appropriate source of silicon, such as methyltrichlorosilane, is also included in the levitating-coating gas mixture, and such may be preferred. Illustrated in FIG. 1 is a source of hydrocarbon 46 which is provided with a flow-regulating valve arrangement 48 alongside a source of inert gas 50, for example argon, helium or nitrogen which is likewise equipped with a suitable flow-regulating valve arrangement 52. These two sources of gas flow into a flexible common line 54 which leads to the central passageway 32 in the lower nozzle 28.

The total flow of levitating-coating gas upward through the coating enclosure is regulated so that the fluidized bed occupies a region generally near the conical bottom surface 30 of the enclosure. The upward flow of the gaseous atmosphere through the central passageway 32 causes a generally toroidal flow pattern to be established within the lower region of the fluidized bed, which in the illustrated arrangement is partially defined by the conical surface 30 of the nozzle 28, with the minute particles traveling upward in the central region and then downward generally along the outer perimeter thereof. However, other arrangements might be used, such as flat-bottomed coating enclosures where the gas mixture enters via a porous frit or a drilled plate, as generally known in this art.

The particles may be chosen so as to have a density greater than the density of the substance being deposited in the bed. When pyrocarbon or pyrocarbon alloyed with a minor amount of silicon carbide is deposited, particles of materials having a density of at least about 3 grams/cm$^3$, and preferably from about 4 to about 5.5 gm/cm$^3$, are used. Examples include refractory oxides, such as alumina, alumina-silica (e.g. mullite) and dense zirconium oxide, e.g. $ZrO_2$ having a density greater than about 5 grams per cm$^3$ and a mullite of a density of about 3.2 gm. per cm$^3$. As such particles are coated, the overall density of the composite or coated particles will gradually become less as they increase in size. In general, the smaller uncoated particles tend to sink to the lower portion of the bed, while the less dense composite particles having a greater thickness of coating are generally levitated higher and reside in the upper portion of the bed. The particles employed preferably are about 1,000 microns or less in size and have a minimum size of about 200 microns. The particles added during the coating run should have an average size not greater than about 400 microns and may be made up of particles between 300 and 425 microns, and the average size of the particles withdrawn should be at least about 500 $\mu$m.

To remove particles from the bed, an exit conduit 56 is provided having an opening of suitable diameter in its upper end. The conduit 56 can extend through the entire lower nozzle 28, or it can be shorter in length and be received in a coaxial counterbore provided at the upper end of a drilled passageway, so as to protrude from the conical surface 30 of the nozzle 28. The exit conduit 56 may be capped at its upper end and have an exit hole 57 in its sidewall. The conduit 56 may be proportioned so that its upper end terminates within the vertical region defined by the conical surface 30, and preferably, the conduit 56 protrudes from the conical surface 30 a maximum vertical distance of less than about 1 inch for a coater having an interior diameter of about 4 inches or less. The exit conduit 56, which extends into the coating region, is formed of a suitable refractory material, such as graphite or mullite.

Particles from the fluidized bed which enter the conduit 56 through the hole 57 fall downward by gravity to a discharge conduit 60 leading to a collection chamber 62 where they are received in a graduated cylinder or beaker 63 or the like so that the total amount and/or volume of particles removed can be determined at any time either optically or through the use of a load cell 92. The collection chamber 62 is pressurized with inert gas from a suitable source 66 which is precisely controlled through the use of a flow-regulating valve arrangement 68 that is remotely controlled, as discussed in detail hereinafter, and fills the chamber with argon or nitrogen at the desired pressure via a flexible conduit 69. The flow of inert gas out of the pressurized collection chamber 62 upward through discharge conduit 60 and the exit conduit 56 not only serves as a purge flow to prevent substantial quantities of dust from falling into the collection chamber, but it also serves to precisely regulate the rate of removal of particles from the fluidized bed, as more particularly discussed in U.S. Pat. No. 3,977,896. By appropriately increasing the pressure within the collection chamber 62, the rate of upward flow of inert gas will increase, with a resultant decrease in the rate of withdrawal of particles from the bed, and such modulation can be used over time to effect a constant rate of withdrawal. If desired, an off-on arrangement can alternatively be used where particles are withdrawn during increments of time, the lengths of which increments are varied to achieve a constant rate of withdrawal over time.

In order to precisely monitor the size of the fluidized bed to maintain it at a precise target value, the signal from a load cell 78 is sent through a suitable line 84 to a control unit 86. The control unit 86 compares the signal being received with a value programmed into its memory to see if a desired weight change pattern is being maintained, and if it is not, the control unit 86 instigates appropriate adjustments which compensate for the change detected. Adjustments are made either by increasing or decreasing the rate at which hydrocarbon is supplied to the coating enclosure.

The control unit 86 is connected by a suitable line 88 through which a signal, e.g. electric, pneumatic, etc., is transmitted to the particle feeder 40 and by a control line 91 leading to the valve 48, which determines the rate of flow of hydrocarbon to the coater. The particle feeder is set to feed particles of a desired size into the coater 20 at a substantially constant rate, and the withdrawal of particles from the bed is also carried out at a constant rate. Although a load cell 78 is the preferred device for monitoring the weight of the bed, other suitable weight-sensing devices can be employed.

Because the arrangement shown in FIG. 1 is such that the load cell 78 is subject to the weight of the withdrawn particles 61, and because an increase in such weight is not indicative of an increase in the weight of the fluidized bed maintained in the coating apparatus 20, a load cell 92 is preferably provided under the beaker 63 into which the withdrawn particles 61 fall. The load cell 92 is connected by a suitable line 94 to the control unit 86 and provides a signal which is indicative of the total weight of the beaker 63 and the particles 61. The control unit 86 is capable of comparing the weight signals from the load cell 92 with the weight signals from the load cell 78. As a result, the control unit 86 is able to subtract, from the increase in overall weight as detected by the load cell 78, the increase in such weight that is attributable to the withdrawn particles 61, thereby excluding such attributable increases from the determination of the fluidized bed size.

In addition, the control unit 86 compares the weight signals from the load cell 92 versus time, thereby determining the precise amounts of particles removed during each desired interval of time, for example, each minute or one-half minute. The load cell 92 thus continuously checks to determine whether particles are being withdrawn at the desired constant rate and effects prompt adjustments in the nitrogen pressure or in the relative lengths of the off-on intervals of time to fine-tune the rate of removal if needed.

In the same vein, the control unit 86 is preferably programmed to take into account the amount of pyrolytic carbon or soot that experience shows will deposit in the exit passageway 36 or the like. As such carbon or soot deposits in the exit passageway 36, this increased weight in the exit passageway 36 is measured by the load cell 78 along with the changing weight of the fluidized bed. Like the increasing weight of the withdrawn particles 61 discussed above, an increase in weight in the exit passageway 36 due to deposits of pyrolytic carbon or soot is not indicative of an increase in the weight of the fluidized bed. However, unlike the increasing weight of the totality of the withdrawn particles, the amount of increase in weight in the exit passageway 36 can be accurately predicted based upon past coating experience, and this information is programmed into the control unit 86. Thus, the control unit 86 adds a deposit factor that has been programmed into it to account for increased weight resulting from the deposition of pyrolytic carbon or soot in the exit passageway 36.

The rate of flow of hydrocarbon as the run begins is considered to be the set point for the coating run, assuming the run is to be carried out under constant coating conditions so as to deposit the same crystalline character carbon throughout the entire run, which is usually the case. It has been found, however, that even when all conditions including the rate at which particles are added and the rate at which they are removed are maintained constant, a dynamic system such as this will encounter excursions wherein pyrocarbon will be deposited at a rate either slightly faster than or slightly slower than the expected rate. Because of these excursions, the bed will either grow in size or be reduced in size, and as a result, the rate at which carbon is being deposited per unit time on the substrates being coated changes. However, the continuous monitoring through measurement of the weight of the bed detects these excursions very soon after they begin, and compensating changes are quickly made by adjusting the amount of hydrocarbon being supplied to the coating zone by either increasing the amount above the set point (in the case where the size of the bed has been reduced), or decreasing the amount of hydrocarbon below the set point (in the case where the size of the bed has grown). The bed weight continues to be monitored, and the weight should return to the target value. When this occurs, it will of course be recognized by the control unit 86, causing the supply of propane to be returned to its set point. In this fashion, there is prompt compensation for excursions in bed size so that the bed quickly returns to its target size, and as a result, the thickness of pyrocarbon being deposited is controlled within very low tolerances so that little if any grinding is needed to obtain precision dimensions, which is critical in medical components such as heart valve components.

Any suitable electronic controller can be used as the control unit 86, such as one commercially available from Inotek/Analog Devices, a UDC 9000 Multi-Pro from Honeywell, or an IBM 386 or 486 computer and Control E.G. software. The control unit 86 can be programmed so as to establish different bed conditions over the length of a coating run, which programmable features are available in commercial controllers; however, in most instances coating conditions are held constant throughout each run. For example, the unit may include a micro-computer that can be programmed so as to employ a relatively large bed size at an early stage of a particular coating run so as to deposit pyrocarbon that better covers inside corners, thereafter gradually decreasing the bed size during a later stage in the run so as to increase the rate of pyrocarbon deposition.

In order to assure the most accurate measuring of weight changes, it is desirable to minimize the total weight to which the load cell 78 is subjected. Thus, as mentioned before, the particle feeder 40 is substantially independently supported by support 39, and it is coupled to the upper stack 27 via a slidable coupling 43, which transmits substantially none of the weight of the particle feeder 40. Similarly, the annular heating section 21, including the outer quartz tube 24, the inner susceptor tube 23, the insulation 25 and the heating coil 44, is substantially supported by an independent support 74. The coating enclosure 29 is thus arranged to "float" vertically within the outer annular heating section 21. The coating enclosure is supported upon a cooling plate 77 that is mechanically coupled to a standpipe 71 via a gas-tight mechanical coupling 72. The standpipe 71 serves as a common gas flow passageway that couples the common line 54 to the central passageway 32. The standpipe 71 is mechanically coupled to and supported by a frame structure 58 using keeper rings 76a and 76b. The cooling plate 77 is positioned within a circular opening in a lower plate 75 that supports the outer quartz tube 24 and the inner susceptor tube 23, and it is sealed thereto by a non-load bearing gas-tight seal 73 (see FIG. 2). Advantageously, the gas-tight seal 73 prevents atmospheric oxygen, from leaking into the region (or duct) between the furnace tube 26 and the graphite inner susceptor tube 23 during the high-temperature coating process where oxidation would occur. The duct is typically 0.040" in radial width. Thus, the heaviest part of the furnace 22 is independently supported, and the load cell 78 bears substantially only the weight of a separate floating body consisting of: the furnace tube 26 (including its associated components, e.g., the upper stack 27, the lower nozzle 28, the fluidized particles and substrates, the exit conduit 56, and the cooling plate 77), the standpipe 71, the frame structure 58, the collection chamber 62, the beaker 63, the withdrawn particles 61, and the smaller load cell 92.

Similarly, the smaller load cell 92 bears substantially only the weight of the beaker 63 and the withdrawn particles 61. Advantageously, this arrangement, whereby the weight to which the load cell 78 is subjected is minimized, allows for maximum precision in measuring the weight change of the fluidized bed.

Referring specifically to FIG. 2, a partial schematic view of the fluidized bed apparatus 20 is shown in section. The bottom of the nozzle 28 is shown resting upon the cooling plate 77, which is coupled to the standpipe 71 via the mechanical coupling 72. The inner susceptor tube 23 and the rest of the annular heating section 21 of the furnace are shown resting upon the lower plate 75. As noted above, the cooling plate 77 is coupled to the lower plate 75 via the non-load bearing gas-tight seal 73. Advantageously, the non-load bearing gas-tight seal 73 provides a slow purge flow of nitrogen gas 79, e.g. about 1 liter per minute, that flows upwardly between the tube 26 and the inner susceptor tube 23, as indicted by the upwardly pointing arrows. The slow upward flow of gas travels between the furnace tube 26 and the inner susceptor tube 23 until it reaches the top of the annular heating section 21 where it is released into the atmosphere. Thus, a positive purge gas pressure is created between the furnace tube 26 and the inner susceptor tube 23, thereby preventing atmospheric gases, e.g., oxygen, from entering this space between where it could oxidize heated graphite components of the coater 20.

As an example of operation of a fluidized bed coating apparatus embodying various features of the invention, a fluidizing flow of an inert gas, such as nitrogen or helium, is established upward through the coater 20 by opening the valve 52 and setting it to supply nitrogen from the source 50, which may be a pressurized tank or the like. Advantageously, the control unit 86 is used to open and set the valve 52 through the control line 93 in response to the execution of a control program. A suitable charge of particles is then added to the coater, through the upper end, to create a fluidized bed. For example, in a coater having an internal coating enclosure diameter of about 3½ inches, one may begin with a charge of about 250 to 700 grams of pyrocarbon-coated zirconium dioxide particles having sizes greater than about 325 microns but less than about 850 microns. Typically, beds of between about 300 g and about 600 g are used for coating leaflets and valve bodies, with beds near the lower end of the range being used for coating leaflets. The particles of this initial bed are pyrocarbon-coated versions of the uncoated zirconia particles that will subsequently be fed into the bed during coating, having a density of about 5.37 grams per cc and a size usually ranging from about 300 microns to about 425 microns (with a preferred average size of about 360 microns); uncoated particles of this type are loaded into the particle feeder 40. For a typical coating operation in a coater of about this size, about 20 to 40 heart valve orifice rings are added to the bed; such rings, when coated, will serve as valve bodies for prosthetic heart valves. Exemplary orifice rings may have the general form of short tubes, having a height of about 0.7 cm., an I.D. of about 1.5 to 2.5 cm. and an O.D. of about 1.6 to 2.6 cm.

The apparatus is then brought up to its operating temperature of between about 1,200 and 2,000° C. using the heating coil 44 so as to uniformly heat the particles to a desired temperature. Typically, the temperature is maintained at about 1,320° C. During this warmup period, a sufficiently high flow of inert gas, e.g. nitrogen, is maintained upward through the particle withdrawal conduit 56, which has an entrance aperture or hole 57 in the form of a 3/16 inch diameter circle. The exit conduit 56 is located so that its exit hole 57 is located about 0.4 inch below the top edge of the conical surface 30 of the nozzle 28 in about the middle of the bed. The bed itself occupies a volume of about 17 cubic inches within the coating enclosure, and the conical surface of the nozzle 28 extends for a vertical distance of about 5 inches. In the illustrated embodiment, the exit hole 57 is located at a level of about 2.5 inches above the bottom of the bed where the total depth of the bed is about 4.0 inches, so that it is located in the lower one-half of the volume of the bed because of the conical configuration.

When the particle bed has reached coating temperature, the substrates to be coated are added to the bed being levitated and brought up to temperature shortly before coating is ready to begin. The valve 48 is then opened, and flow of a suitable coating gas, such as propane, is added to the fluidizing gas that is already flowing through the flexible common line 54 and the central passageway 32. As with the valve 52, the valve 48 is opened by the control unit 86 through the control line 91. In order to provide some alloying of the pyrocarbon being deposited with silicon carbide, methyltrichlorosilane is preferably added to the gas stream flowing in the line 54 from a suitable source (not shown) as is well known in this art. The flow rate of the inert gas is adjusted, as necessary, so that the flow of the fluidizing-coating gas mixture upward through the coating enclosure, measured at standard temperature and pressure, contains about 13 liters per minute nitrogen, about 7 liters per minute propane and about 6 grams per minute methyltrichlorosilane, which are considered to be the set points of the individual components for this coating run.

As soon as coating begins, the feeder 40 is caused to feed uncoated zirconia particles into the apparatus at the rate of about 2 grams per minute via the entrance conduit 42 through which they fall into and become a part of the fluidized bed. Because of their greater density, the smaller, uncoated particles quickly gravitate to a lower level in the bed. A purge flow of about 4 liters of nitrogen per minute is maintained through the entrance conduit 42, flowing past the falling zirconia particles. The output signals from the load cells 78 and 92 are transmitted to the control unit 86, where they are analyzed to determine whether appropriate adjustments need to be made in order to maintain the bed size at the desired value throughout the coating run. If the total bed surface area begins to shrink, as indicated by a decrease in the weight monitored by the control unit, the unit incrementally increases the amount of propane being supplied, e.g. to 7.1 1/min. (up to an increase of about 10%, i.e. to about 7.7 liters/min.), until such measured decreases cease as a result of the supply of more hydrocarbon to the coating zone. As the bed builds back to the desired value, the rate of supply of hydrocarbon is returned to its set point.

At the conclusion of coating and cool-down, the coated articles are examined, and the SiC-alloyed pyrocarbon is found to be of high quality and to have a uniform thickness which varies by less than about 0.001 inch from the desired thickness which was intended to be achieved in this coating run. Thus, it is shown that through the mechanism of monitoring the weight change of the fluidized bed in the described manner, an extremely accurate measure of the bed size is obtained, which is immediately used as input to a control unit to make compensating changes as necessary so as to achieve and maintain a preselected bed size within the coating enclosure and thus accomplish precise control of the rate of pyrocarbon deposition throughout the duration of a coating run to achieve a precise thickness of deposit of pyrocarbon of constant crystallinity throughout.

Shown in FIG. 3 is an alternative embodiment of a coating system that can also be employed to achieve precise coating of pyrocarbon on substrates such as valve bodies and occluders for mechanical heart valves. Although the coating apparatus is similar to that described with respect FIG. 1, a different method is used to monitor for excursions in the size of the fluidized bed. Whereas the FIG. 1 embodiment monitored the weight of the bed by monitoring the weight of the entire coating chamber and particle collection arrangement and subtracting a tare weight value which was generally the weight at the beginning of the coating run, the system shown in FIG. 3 monitors pressure differential across the bed.

More specifically, a fluidized bed coating apparatus 120 is illustrated in FIG. 3 which includes a furnace 122 having an outer cylindrical shell 124 within which the coating enclosure is located. The coating enclosure is generally separated from the cylindrical outer shell of the furnace by a layer of insulation 125 and is defined generally by a thin sleeve or tube 126 in combination with a lower insert 128. The lower insert 128 mates with the bottom end of the thin tube 126 and provides the coating enclosure with a conical bottom surface 130; it includes a central passageway 132 that extends vertically upward therethrough and is preferably coaxial with the thin tube 126 which is of circular cross-section. Although there should be no size limitations on such coaters, of general interest are coaters having tubes 126 not greater than about a foot in diameter and particularly those having an interior diameter of about 6 inches or less. The levitating atmosphere flows upward through this passageway 132 to enter the coating enclosure.

The upper end of the furnace tube 124 includes a plate 133 which centers the coating tube 126 therewithin, and an exit passageway 136 from the coating enclosure is defined by an upper insert 134 which extends downward into the furnace and narrows the outlet opening somewhat, which insert has a frustoconical lower surface 137. The hot levitating and coating gases leaving the fluidized bed coater pass through this upper exit passageway 136 and flow to an appropriate vent.

A particle feeding device 140 is mounted generally above the fluidized bed coater 120 and is designed to feed minute particles 141 into the coating enclosure at a desired rate. The particles from the feeder 140 enter the coater through an entrance conduit 142 which extends downward through the wall of the upper insert 134 terminating at the frustoconical surface 137. A suitable induction or alternating current heating device 144 is provided, as well known in this art, and is disposed in surrounding relationship to the furnace tube 124 in order to heat the active deposition region of the coating enclosure, together with the small particles and the objects being levitated, to bring them to the desired deposition temperature for coating.

The coating operation is carried out by establishing a levitated bed of minute particles, submillimeter in size, which is maintained in the lower region of the coating enclosure; this bed extends, as illustrated, into the conical region defined by the upper end surface 130 of the lower insert. Once the bed is established and brought up to coating temperature by applying an appropriate amount of electrical power to the heating unit 144, one or more objects to be coated, such as annular valve bodies or occluders for prosthetic heart valves, are appropriately loaded into the bed through the upper exit passageway 136 shortly before coating is ready to begin. Once in the bed, these objects are supported among the fluidized particles by the upwardly flowing gaseous stream and are likewise heated to raise their temperature to the desired coating temperature. The temperature within the coating enclosure is appropriately monitored and controlled as is well known in this art, as described hereinbefore.

The upwardly flowing gas stream, during the time of coating, is made up of a mixture of an inert fluidizing gas plus a carbonaceous substance, preferably a gaseous hydrocarbon, as described hereinbefore. A desired amount of an appropriate source of silicon, such as methyltrichlorosilane (MTS), may also be included in the levitating-coating gas mixture as by adding MTS from a suitable source (not shown) to the flow of inert gas. Illustrated in FIG. 3 is a source of hydrocarbon 146 which is provided with a flow-regulating valve arrangement 148 alongside a source 150 of inert gas, for example argon, helium or nitrogen, which is likewise equipped with a suitable flow-regulating valve arrangement 152. These two gas sources flow into a common line 154 which leads to the vertical passageway 132 in the lower insert 128.

The total flow of levitating-coating gas upward through the coating enclosure is regulated so that the fluidized bed occupies a region generally near the bottom portion of the tube 126. The upward flow of the gaseous stream through the central passageway causes a generally toroidal flow pattern to be established within the lower region of the fluidized bed, which is partially defined by the conical surface 130 of the insert 128, with the minute particles traveling upward in the central region and then downward generally along the outer perimeter of this toroidal flow pattern.

The particles may be chosen so as to have a density greater than the density of the pyrocarbon being deposited in the bed, as described hereinbefore. The particles are about 1,000 microns ($\mu$m) or less in size, and preferably, the original bed is made of particles not greater than about 850 microns. The particles added during the coating run preferably have an average size not greater than about 400 microns. Generally particles between about 300 and about 425 microns are added during the coating run, and the average size of the particles withdrawn over the coating run is greater than about 500 $\mu$m.

To remove particles from the bed, an exit conduit 156 is provided having a circular opening of a suitable diameter in its upper end. The conduit 156 can extend through the entire lower insert 128, or it can be shorter in length and be received in a coaxial counterbore provided at the upper end of a drilled passageway 156a, so as to protrude from the conical surface 130 of the insert. The exit conduit 156 may open straight up or be capped at its upper end and have an exit hole in its sidewall as described hereinbefore. The conduit 156 may be proportioned so that its upper end terminates within the vertical region defined by the conical surface 130, and preferably, the conduit 156 protrudes from the conical surface 130 a maximum vertical distance of less than about 1 inch for a coater having an interior diameter of about 4 inches or less. The exit conduit 156, which extends into the coating region, is formed of a suitable refractory material, such as graphite or mullite.

Particles from the fluidized bed which enter the conduit 156 through the hole fall downward by gravity to a discharge conduit 160 leading to a collection chamber 162 where they are received in a graduated cylinder 163 or the like so that the total amount and/or volume of particles removed can be determined at any time either visually or through the use of a load cell 165. The collection chamber 162 is pressurized with inert gas from a suitable source 166 which is precisely controlled through the use of a flow-regulating valve arrangement 168 that is suitably set by a control arrangement discussed in detail hereinafter. The flow of inert gas out of the pressurized collection chamber upward through discharge tube 160 and the exit conduit 156 serves both as a purge flow to prevent substantial quantities of dust from falling into the collection chamber and also to precisely regulate the rate of removal of particles from the fluidized bed. By increasing the gas pressure within the collection chamber 162, the rate of upward flow of inert gas will increase, with a resultant decrease in the rate, or a total cessation, of withdrawal of particles from the bed. Decrease of gas pressure, continuously or periodically, increases rate of withdrawal of particles over time. Feeding particles at a constant rate and withdrawing particles at a constant rate permits the amount of particles in the bed to be maintained at a precise predetermined level throughout a coating run.

It has been found that maintaining the bed size of the fluidized particle bed within a coating enclosure in the region where the coating deposition is occurring is a most important parameter in precisely controlling the rate of deposition and the character of the pyrocarbon being deposited. Measurement of the pressure difference ($\Delta$P) across the fluidized bed so as to detect changes that occur is one effective way of sensing even small changes in overall bed size. By monitoring the pressure difference across the bed, i.e. between a point at a lower region in the bed or just below the bed and a point above the bed, to detect changes which occur and then responding to such detected changes from the desired target value to compensate for such, precise control of pyrocarbon deposition is achieved throughout a coating run.

Such monitoring is accomplished in the illustrated apparatus by employing a pair of dedicated, pressure-sensing ports in the region of the coating enclosure. In the illustrated embodiment, an upper pressure sensing port 170 is provided in the form of an elongated passageway which extends through the upper insert 134, and a lower pressure-sensing port 172 is provided via a long passageway in the lower insert 128. The lower port 172 is preferably located in the lower one-half of the volumetric region of the bed or below the bed, and it is more preferably located in the lower 25% of the volume of the bed. The upper port 170 and the lower port 172 are respectively connected via tubing 174, 176 to a pressure transducer 178 for measuring the pressure at these ports and comparing the two pressures measured to determine the difference between the two measured pressures. If desired, optional, visually-readable gauges can be included. Although a pressure transducer 178 is preferred, other suitable pressure-measuring devices, such as manometers, can alternatively be used. To keep the ports and the tubing clear of dust, carbonaceous material and/or particles, an appropriate slow purge flow of inert gas (not shown) is maintained through both port systems. Purge flows for each of the ports 170, 172 are constant, with purge gas being appropriately injected into the tubings 174, 176. An initial pressure measurement is taken at the beginning of each coating run that takes the respective purge flow into consideration, and it serves as a reference point for that coating run.

A signal from the pressure transducer 178 is sent through a suitable line 184 to a control unit 186. The control unit 186 compares the signal being received with the values programmed into its memory to see if the desired pattern is being maintained, and if deviation is detected, the control unit 186 instigates appropriate adjustments. Adjustments to bed size are made by changing the rate at which hydrocarbon is fed to the bed as a part of the fluidized gas flow, and it has been found that the amount of hydrocarbon being supplied to the coating zone can be changed within ±10% of its initial value without measurably affecting the pyrocarbon properties while having a very significant effect upon the rate of deposition. Accordingly, the control unit 186 is connected by a suitable line 190 through which a signal, preferably electric, is transmitted to the control valve 148, which determines the rate of flow of hydrocarbon through the inlet conduit 154. It is convenient to set the particle feeder to feed particles of a desired size into the coater 120 at a substantially constant rate, and a control line 188 leading to the feeder 140 is provided for this purpose.

It is likewise advantageous to remove particles from the fluidized bed at a desired constant rate, the load cell 165 under the beaker 163 into which the removed particles fall is connected by suitable control line 194 to the control unit 186 and provides a signal which is indicative of the total weight of a beaker and particles. The control unit compares the weight versus time and thereby determines whether the precise amount of particles intended has been removed during each preset interval of time, for example, each 30 or 60 seconds. As a result of this precise determination which is accomplished by using the load cell 165, the control unit 186 causes minor changes to be made either in the rate of flow of nitrogen upward through the particle removal conduit 160 or in the off-on intervals of high gas flow, whenever needed to maintain the desired constant rate of withdrawal of particles over time.

When a coating run is begun, a predetermined bed size is established by loading a precise amount of pyrocarbon-coated $ZrO_2$ particles to provide that size, and by then setting the temperature and the flow rates of inert gas (nitrogen) and hydrocarbon (propane), as well as setting the constant rate of feeding particles and the constant rate of withdrawal of particles. This is all conveniently done through the control unit which also uses control lines 191 and 193, which respectively lead to the adjustable valves 152 and 168.

Any suitable electronic controller can be used, as described hereinbefore. A control unit 186 can be employed which is capable of being programmed so as to establish different bed conditions over the length of a coating run, e.g. a continuous gradient, because such programmable features are available in commercial controllers. For example, a mini-computer can be programmed so as to, cause pyrocarbon to be deposited more slowly during an early stage of a particular coating run and thereby better cover inside corners. If desired, the physical characteristics of the coating being deposited on a particular substrate might be altered in this manner. By monitoring for changes in pressure difference indicative of changes in bed size and immediately effecting compensating changes, as necessary, to return the bed to the target size, the rate at which pyrocarbon is deposited is very carefully controlled throughout an entire run of several hours in length, and a precise thickness of pyrocarbon coating can be deposited during a particular coating run. In this manner, it is possible to repeatedly coat particular objects with pyrocarbon coatings of a carefully controlled, desired thickness, i.e., to a precision of within about 1 mil (0.001 inch). This is a particularly valuable advantage of the invention when coating certain parts, such as parts for prosthetic heart valves, wherein precision in achieving tolerances is extremely important and thus commercially very valuable.

Although a pressure transducer 178 is the preferred device for monitoring the pressure above the bed and either just below or in a lower region of the bed, other suitable pressure sensing devices can be employed. For example, a water manometer can be employed in order to directly measure the pressure difference between the two ports 170 and 172, or separate manometers or other precise barometric-type apparatus can be used to individually measure the pressures and thereafter compare the results measured.

It has also been found to be satisfactory to have the pressure transducer 178 simply monitor atmospheric pressure outside the coating apparatus 120, instead of monitoring the pressure just above the particle region of the bed in the enclosure, because under these circumstances the pressure therein is essentially atmospheric. Accordingly, by simply monitoring atmospheric pressure and comparing it with the pressure in the lower region of the bed monitored via the conduit 172 and feeding a signal representative of the difference between these two values to the control unit 186 provides an adequate alternative way of making measurements to detect changes in the bed size for which immediate compensation is effected in order to precisely obtain the coating characteristics and thicknesses desired in a pyrocarbon deposition run.

As an example of operation of a fluidized bed coating apparatus embodying various features of the invention, a fluidizing flow of an inert gas, such as nitrogen, is established upward through the coater 120 by opening the valve 152 and setting it via the control line 191 to supply nitrogen at a desired rate of flow from the source 150, which may be a pressurized tank or the like. A suitable charge of particles is then added to the coater, through the upper end, to create a fluidized bed. For example, in a coater having an internal coating enclosure diameter of about 3½ inches, one may begin with a charge of about 250 to about 700 grams of pyrocarbon-coated zirconium dioxide particles having sizes greater than about 325 microns but less than about 850 microns. The particles of this initial bed are pyrocarbon-coated versions of the uncoated zirconia particles that will subsequently be fed into the bed during coating. The uncoated particles have a density of about 5.37 grams per cc and a preferred size ranging from about 300 microns to about 425 microns (with an average size of about 360 microns) and are loaded into the particle feeder 140. For a typical coating operation in a coater of about this size, about 20 to 40 heart valve orifice rings are added to the bed; such rings, when coated, will serve as valve bodies for prosthetic heart valves. Exemplary orifice rings generally have the form of short tubes, having a height of about 0.7 cm., an I.D. of about 1.5 to 2.5 cm. and an O.D. of about 1.6 to 2.6 cm. U.S. Pat. Nos. 5,152,785 and 5,192,309 show generally representative heart valves using valve bodies of this general type. The substrates to be coated are added after the particle bed has been brought up to its operating temperature of about 1320° C. using the induction heating apparatus 144.

The apparatus is then operated until both the particles and the objects reach the desired temperature. During this warmup period, the control unit via the control line 193 causes a sufficient flow of nitrogen to be maintained upward through the conduit 156, which has an entrance aperture in the form of about a 3/16 inch inner diameter open upper end, to prevent particle withdrawal. A purge flow rate of about 4 liters per minute of nitrogen is maintained through the lower pressure port 172 so as to prevent particles from entering this port. The exit conduit 156 is located so that its open upper end is located about 0.4 inch below the top edge of the conical surface 130 of the lower insert 128, wherein it is in about the middle of the bed. The bed itself occupies a volume of about 17 cubic inches within the coating enclosure, and the conical surface of the lower insert has a vertical height of about 5 inches. In the illustrated embodiment, the port 172 is located at a level of about 2.5 inches above the bottom of the bed where the total depth of the bed is about 4.0 inches; however, it is located in the lower one-half of the volume of the bed because of the partially frustoconical configuration thereof.

When a coating run is ready to begin, the control unit 186 causes the valve 148 to be opened to its predetermined set point, as desired for this particular run, and flow of a preferred coating gas, i.e. propane, is begun so that a mixture of it and the fluidizing gas that is already flowing through the line 154 into the central passageway 132 is being supplied at the desired rates of flow. In order to provide some alloying of the pyrocarbon being deposited with silicon carbide, which has been found to improve strength and crack resistance of the ultimate coating, methyltrichlorosilane (MTS) is preferably added to the gas stream. The flow rates of the inert gas, propane and MTS are set so that the flow of the fluidizing-coating gas mixture upward through the coating enclosure, measured at standard temperature and pressure, is about 13 liters/minute of nitrogen, about 7 liters/minute of propane and about 5 grams/minute methyltrichlorosilane vapor, which rates are referred to as the set point values, for a total flow of about 20 liters/min. As soon as the coating run begins, the feeder 140 is caused to feed uncoated zirconia particles into the apparatus at a constant rate of about 2 grams per minute via the entrance passageway 142 through which they fall into and become a part of the fluidized bed. Because of their greater density, the small uncoated particles 141 quickly gravitate to a lower level in the bed. The control unit 186, via the valve 68 and the control line 193, controls the amount of nitrogen which flows upward through the particle discharge passageway 160 so that particles are withdrawn at a constant rate of about 8.0 grams per minute, which rate is maintained throughout the entire coating run. A purge flow of about 4 liters of nitrogen per minute is maintained through the entrance passageway 142, flowing along with the falling zirconia particles, and a purge flow of about 1 liter of nitrogen per minute is maintained through the tubing 174 leading to the upper pressure sensing port 170.

The pressure difference between the lower port 172 and the upper port 170 is monitored throughout the coating run by a pressure transducer 178 (e.g. a commercially available Sensotec Model Z or a SETRA Model C239). An output signal from the transducer which is representative of the difference in measured pressures is transmitted to the electronic controller 186, and it is compared, for example, each 15 seconds, with a program that is representative of the desired bed size. The control unit 186 thus monitors the pressure differential and, as soon as changes are detected, causes appropriate adjustments to be made in the rate of propane being supplied to the coating enclosure through the inlet 132 throughout the entire coating run, which may typically take between about two and about four hours.

For example, when an increase in pressure differential is detected above the target value which is indicative that growth in the bed size has occurred, the control unit 186 acts to compensate for this growth. As a fluidized bed grows larger in a coating operation such as this, there is greater surface area available for pyrocarbon deposition; however, the effective rate at which pyrocarbon is deposited on the orifice rings or other substrates which are being coated begins to slowly decrease. To quickly counteract this growth of the bed size, the rate at which propane is supplied is reduced, preferably incrementally for example, from 7 liters/min. to 6.9 liters/min. Such incremental reductions continue until the pressure differential being monitored indicates that the bed has ceased growing. Thereafter, as the pressure differential being monitored indicates that the bed is returning to the target value, the rate at which propane is being supplied is gradually, preferably incrementally, returned to the set point of 7 l/min. If desired so as to keep the overall flow rate through the coater the same, e.g. at 20 l/min., an opposite change in the rate of supply of inert gas can be made to counterbalance the change in the rate of supply of propane; for example, if propane supply is decreased to 6.8 l/min., the flow of nitrogen can be proportionately increased to 13.2/min. However, such proportional changes in the inert gas flow rate are not considered to be necessary, as changes in the amount of propane in the form of increases or decreases of not more than 10 percent of the volumetric flow of propane are not considered to significantly affect the fluidizing properties of the levitating gas flow through the coater. Therefore, although preferred, balancing changes in the inert gas flow are not required.

The exemplary coating operation is carried out for about 180 minutes under conditions so as to initially maintain desired bed size throughout the entire coating run. At the conclusion of the coating run and cool-down, the coated articles are examined and the SiC-alloyed pyrocarbon is found to be of high quality and to have a precise uniform thickness of substantially 0.010 inch, having a tolerance within about 0.001 inch of the desired value.

Very generally, methods and apparatus are provided which allow the very precise control of the deposition of pyrocarbon onto a substrate being levitated in a fluidized bed of particles. Through the mechanism of monitoring the pressure difference between the region above the bed, which in many instances will be at substantially atmospheric pressure, and the region in the lower 25 percent of the bed volume (or just below), an extremely accurate measure of the bed size is obtained. This measure is then used as input to a control unit which is designed to make changes as necessary to the rate at which hydrocarbon is supplied so as to achieve a constant coating rate within the coater, thereby accomplishing a precise rate of deposition of pyrocarbon of constant crystalline characteristics throughout an entire coating run.

Although the invention has been described with regard to certain preferred embodiments, it should be understood that various changes and modifications as would be obvious to one having the ordinary skill in this art can be made without departing from the scope of the invention which is defined solely by the claims appended hereto. For example, although the description has dealt with the deposition of pyrocarbon or silicon carbide alloyed pyrocarbon, other carbide alloying materials can be used, for example, zirconium carbide or tungsten carbide. Likewise, although propane has become the preferred hydrocarbon for coating purposes, other hydrocarbons have previously been used to deposit high quality pyrocarbon and can alternatively be employed either singly or as mixtures with propane.

Particular features of the invention are emphasized in the claims which follow.

What is claimed is:

1. A method of controlling the rate of deposition of pyrocarbon onto a substrate while it is being levitated in an enclosure along with a fluidized bed of particles in order to produce a precise thickness of deposit of pyrocarbon of uniform crystalline properties, which method comprises establishing a bed of particles in fluidized condition in a coating zone within an enclosure along with at least one substrate to be coated, all of which are levitated by supplying an upward flow of a gaseous atmosphere which comprises an inert gas, heating said bed of particles and said substrate to a pyrolysis temperature in said coating zone and supplying said levitating gaseous atmosphere in a form that includes a mixture of a hydrocarbon component and an inert gas component, each of which components is supplied to said coating zone at a certain initial flow rate, such that pyrolysis of said hydrocarbon occurs causing pyrocarbon to be deposited upon surfaces of said substrate and upon said particles in said coating zone, monitoring either (a) the weight of said fluidized bed, or (b) the differential pressure between a location within or below said bed and a location above said bed, to determine changes that occur either in said weight or in said differential pressure, and adjusting the amount of said hydrocarbon component being supplied as a part of said upward coating flow based upon changes determined to have occurred either in said weight or in said differential pressure so as to compensate for such changes and thereby precisely regulate the rate of deposition of pyrocarbon over time and thereby produce a precise thickness of pyrocarbon coating of uniform crystalline properties upon said surfaces of said substrate during a coating run lasting for a definite period of time.

2. A method according to claim 1 wherein said hydrocarbon is propane.

3. A method according to claim 2 wherein said inert gas constitutes at least about 50 volume percent of said gaseous atmosphere which also includes an organic silicon compound, which compound decomposes at said pyrolysis temperature to deposit silicon carbide alloyed with said pyrocarbon.

4. A method according to claim 2 wherein said temperature is maintained between about 1250° C. and about 1400° C.

5. A method according to claim 4 wherein said propane is maintained in said levitating gaseous atmosphere between about 20% and about 60% by volume.

6. A method according to claim 4 wherein the flow rate of said propane being supplied to said enclosure to create said upward flow is increased or decreased within a range of not more than about 10% from said initial propane flow rate.

7. A method according to claim 6 wherein said inert gas is supplied at a flow rate which is increased or decreased to inversely correspond to each change in flow rate of propane.

8. A method according to claim 1 wherein said differential pressure is monitored and wherein said pressure is measured at a location within said fluidized bed which is within the lower one-half of said bed, based upon total volume of said bed.

9. A method according to claim 8 wherein said pressure within said bed is measured via a port through which inert gas is constantly flowed and wherein said pressure is monitored above said bed at a location at the end of a passageway extending into said enclosure.

10. A method according to claim 1 wherein particles are continuously added to said bed at a rate of a certain number of grams per minute and particles are withdrawn from said bed at a constant rate over time throughout said coating run of said substrate.

11. A method according to claim 10 wherein said particles being added are zirconium dioxide having a density greater than the density of said pyrocarbon being deposited.

12. A method according to claim 1 wherein the weight of said fluidized bed is monitored by:

initially weighing at least a portion of said enclosure wherein said bed is established such that said bed is weighed along with said at least a portion of said enclosure;

periodically reweighing said portion of said enclosure at desired intervals so as to determine periodic changes in the overall weight thereof over said intervals; and determining changes in weight of said bed over said intervals based on said periodic changes in said overall weight.

13. A method according to claim 12 wherein said determining step includes the step of subtracting a deposit factor from said overall weight, said deposit factor being an approximation of the weight of pyrolytic carbonaceous material deposited onto said portion of said enclosure following said initial weighing so that compensation is made therefor in determining any said change in said weight of said bed.

14. A method according to claim 13 wherein said determining step includes the step of measuring the weight of the particles withdrawn from said bed which are included in said overall weight.

15. A method according to claim 14 wherein said overall weight is measured using at least one load cell.

16. A method of controlling the rate of deposition of pyrocarbon onto a plurality of heart valve component substrates while being levitated in an enclosure along with a fluidized bed of particles in order to produce a precise thickness of deposit of pyrocarbon of uniform crystalline properties, which method comprises establishing a bed of particles in fluidized condition in a coating zone within an enclosure along with the substrates to be coated, all of which are levitated by supplying an upward flow of a gaseous atmosphere which comprises an inert gas, heating said bed of particles and said substrates to a pyrolysis temperature in said coating zone and supplying said levitating gaseous atmosphere in a form that includes a mixture of a hydrocarbon component and an inert gas component, each of which components is supplied to said coating zone at a certain initial flow rate, such that pyrolysis of said hydrocarbon occurs causing pyrocarbon to be deposited upon the surfaces of said substrates and upon said particles in said coating zone, monitoring said fluidized bed within said coating zone to determine changes that occur which are indicative of a change in the size of said fluidized bed, and periodically changing the flow rate of said hydrocarbon component from said initial flow rate to periodically adjust the amount of said hydrocarbon component being supplied as a part of said upward coating flow, based upon each said change so determined to have occurred, as to compensate for such changes and thereby precisely regulate the rate of deposition of pyrocarbon over time and thereby produce a precise thickness of pyrocarbon coating of uniform crystalline properties upon the surfaces of said substrates during a coating run lasting for a definite period of time.

17. A method of controlling the rate of deposition of pyrocarbon onto a plurality of heart valve component substrates while being levitated in an enclosure along with a fluidized bed of particles in order to produce a precise thickness of deposit of pyrocarbon of uniform crystalline properties, which method comprises establishing a bed of particles about 1000 microns or less in size in fluidized condition in a coating zone within an enclosure along with the substrates to be coated, all of which are levitated by supplying an upward flow of a gaseous atmosphere which comprises an inert gas, heating said bed of particles and said substrates to a pyrolysis temperature in said coating zone and supplying said levitating gaseous atmosphere in a form that includes a mixture of a hydrocarbon component in the form of methane, ethane, propane, butane acetylene, propylene or a mixture thereof and an inert gas component, each of which components is supplied to said coating zone at a certain initial flow rate, such that pyrolysis of said hydrocarbon component occurs causing pyrocarbon to be deposited upon the surfaces of said substrates and upon said particles in said coating zone, monitoring said fluidized bed within said coating zone to determine changes that occur which are indicative of a change in the size of said fluidized bed, and changing the flow rate of said hydrocarbon component by an amount not greater than about 10% of said initial flow rate to periodically adjust the amount of said hydrocarbon component being supplied to said coating zone as a part of said upward coating flow, based upon each said determined change, to compensate for such changes and precisely regulate the rate of deposition of pyrocarbon over time and thereby produce a precise thickness of pyrocarbon coating of uniform crystalline properties upon the surfaces of said substrates during a coating run lasting for a definite period of at least about 2 hours.

* * * * *